United States Patent [19]
Greco et al.

[11] 3,973,320
[45] Aug. 10, 1976

[54] METHOD FOR THE PRODUCTION OF SEMICONDUCTOR DEVICES WITH AN INTEGRAL HEATSINK AND OF RELATED SEMICONDUCTOR EQUIPMENT

[76] Inventors: Giovanni Greco, Via Monte 41, 00141 Rome; Maurizio Tomassini, Via Cassia 1020, 00191 Rome, both of Italy

[22] Filed: Sept. 3, 1974

[21] Appl. No.: 502,307

[30] Foreign Application Priority Data
Sept. 6, 1973  Italy ........................... 52366/73

[52] U.S. Cl. ............................. 29/578; 29/580; 29/583; 29/591; 357/81
[51] Int. Cl.² ................................. H01L 21/288
[58] Field of Search ............ 29/580, 583, 591, 578; 357/81

[56] References Cited
UNITED STATES PATENTS

| | | | |
|---|---|---|---|
| 3,453,722 | 7/1969 | Ramsey, Jr. et al. | 29/580 |
| 3,689,993 | 9/1972 | Tolar | 29/580 |
| 3,794,883 | 2/1974 | Bylander et al. | 357/81 |
| 3,850,707 | 11/1974 | Bestland | 29/580 |

*Primary Examiner*—Carl E. Hall

[57] ABSTRACT

A process for producing a semiconductor device with an integral heatsink involving applying a coating of dielectric to a sheet of semiconductor material, removing part of the dielectric coating by etching to leave specific sink zones, coating the zones with a metal layer, bonding the assembly to a support with adhesive, depositing a layer of metal to the non-adhered surface of the semiconductor sheet in areas corresponding to the sink zones, and removing semiconductor material from the body of the sheet between the sink zones to produce mesa profile units with heatsinks.

15 Claims, 8 Drawing Figures

METHOD FOR THE PRODUCTION OF SEMICONDUCTOR DEVICES WITH AN INTEGRAL HEATSINK AND OF RELATED SEMICONDUCTOR EQUIPMENT

The present invention concerns a procedure for the production of semiconductor devices with an integral heatsink or means for dissipating heat through attachments, and also for the production of related semiconductor devices. The invention deals especially with a method for the production of semiconductor devices of the type where the separation of the individual devices occurs automatically in the same incision device which creates the very structure thereof. As is known, heat dissipation is a very delicate problem for all microwave devices, because their operating conditions call for high power densities, usually in excess of $10^8$ watts per $cm^3$. Therefore, the operating temperature of the device becomes rather high in the active zone of the diode, usually much higher than 100° C. The most common solution for this heat problem, at present, is to establish a direct contact of the active zone of the device with a heat-diffusion member, for example, a block of copper which is gold-plated, and this can be produced by a soldering process under use of pressure, as described in the article by A. M. Cowley, "Design and Application of Silicon Impatt Diodes", Hewlett-Packard Journal, May, 1970, Page 4. Another solution is to use an integral heatsink having a continuous electrolytic coating in the heat dissipator on the surface of the wafer on the side of the P⁺ / N junction of the diode, whereafter one forms the Mesa (center) structure directly upon the heat-dissipating part, and then separates the individual diodes by a mechanical cutting from the dissipator; this is shown in R. A. Zettler and A. W. Cowley, "Batch Fabrication of Integral Heatsink IMPATT Diodes", Electronics Letters, Vol. 5, No. 26 (December 27, 1969); also B. Hoefflinger, "Recent Developments on Avalanche Diode Oscillators", Microwave Journal, Vol. 12, No. 3 (March, 1969). It should be pointed out that the technique of thermocompression as offered in the first solution is beset with serious problems, because it is difficult to consistently reproduce the same soldering step with the same quality thermal and mechanical characteristics, of the soldered spot.

With respect to the second prior art solution outlined above, it must be kept in mind that the electrolytic deposition of a heat dissipator of appreciable thickness, which is a continuous metal layer of a thickness of 100 or more microns upon a large surface which often is greater than 10 $cm^2$, as this is the case for the constructions dealt with here, is bound to bring about the creation of an internal stress which could give rise to possible deformations in the equipment, with the consequence of deterioration of its mechanical characteristics. Furthermore, the separation of the individual semiconductor devices produced by a mechanical cutting of the heatsink, because the thickness of the metal of this sink is so great, easily introduces additional strains in the metal, which is frequently the cause of a damage to the semiconductor device, so that the electrical characteristics thereof deteriorate. Further, such a mechanical technique always brings about a surface contamination of the semiconductor, with a possibility of losses due to surface currents.

In the solution proposed by the invention described hereafter, the electrolytic deposition occurs in what one may term "an insular manner", i.e., individual, small depositions form the heatsink.

It is now the fundamental concept of the present invention to bring about a process for the production of semiconductor devices with an integral heatsink which eliminates or at least reduces essentially the disadvantages of prior methods. The invention has in its scope furthermore to disclose a process which is fully compatible with the operatory techniques presently used in the production of semiconductor devices.

The technique proposed in the present invention, when it is used to prepare equipment in the manner of a batch process, offers the advantage of bringing about very high yields, which are superior to the yields experienced under prior art procedures. The new technique of the present invention allows an automatic separation of all the devices from each other, which were created as one batch, whereas the procedures of the prior art require a mechanical cutting. Another advantage of the present invention is the great flexibility of the planning with respect to dimensions and structure of the integral heatsink. The present invention avoids the prior art limitations with respect to the shape of the dissipator. Where the prior art process of mechanical cutting is involved, it is impossible to create shaped dissipators, as for example, circular.

Another advantage of the present invention is that it permits obtaining of very small dimensions for parts to be used in microcircuits.

The invention thus has as special scope a procedure for the production of semiconductor devices with integral heatsinks starting out from semiconductor materials which have a P⁺ / N or an N⁺ / P junction, and it involves the steps of covering uniformly a wafer of semiconductor material with a layer of dielectric; applying photographically incisions in the dielectric layer of the surface of the wafer covering the junction, which is limited to a finite number of zones which shall constitute the locations of the sinks; covering such zones with a layer of a flexible metal, the thickness of which is built up electrolytically; attaching said wafer with an adhesive to a support upon the surface which covers the junction; thinning or finishing or smoothing the opposite surface of the wafer; depositing a flexible metal layer upon said second surface in zones which will form the electrical resistance contact of the device, which zones correspond to the zones of metal deposition upon the first surface and which are exactly aligned therewith; and removing from the body of the wafer, in the spaces which form the interstices between and among those zones, the semiconductor material so that one obtains the separation of the semiconductor units with Mesa profile, equipped with sinks.

It should be pointed out that the process of the invention is applied to slices or wafers of semiconductor material where the P⁺ / N or the N⁺ / P junction was created either by thermal diffusion or by ionic implant by formation of a rectifier barrier metal-semiconductor, or also by epitaxial growing.

The dielectric layer can be obtained by a heating in an oxidizing atmosphere, by a cathodic deposition at low pressure of the dielectric material, by precipitation by evaporation in vacuo of the dielectric material, by a reactive deposition of silicon oxide (or another dielectric) at a low temperature, by anodic oxidation, or by deposition of oxides in the shape of emulsions.

With regard to the deposition of the flexible metal layer, this can be accomplished by use of one of the following techniques: Evaporation in vacuo, cathodic deposition at low pressure, electrolytic deposition, or chemical deposition without the passage of any electrical current.

The formation of the zones where the sinks are located and of the zones of ohmic contact may be brought about by a photographic etching or by deposition across a screen.

To accomplish the thinning or smoothening of surfaces, one uses the techniques of deburring, sanding and the electrochemical process.

The technique for the formation of the Mesa structure involves chemical attack or sanding.

The invention shall be described with reference to the accompanying drawings, which describe a preferred embodiment.

Figure 8:
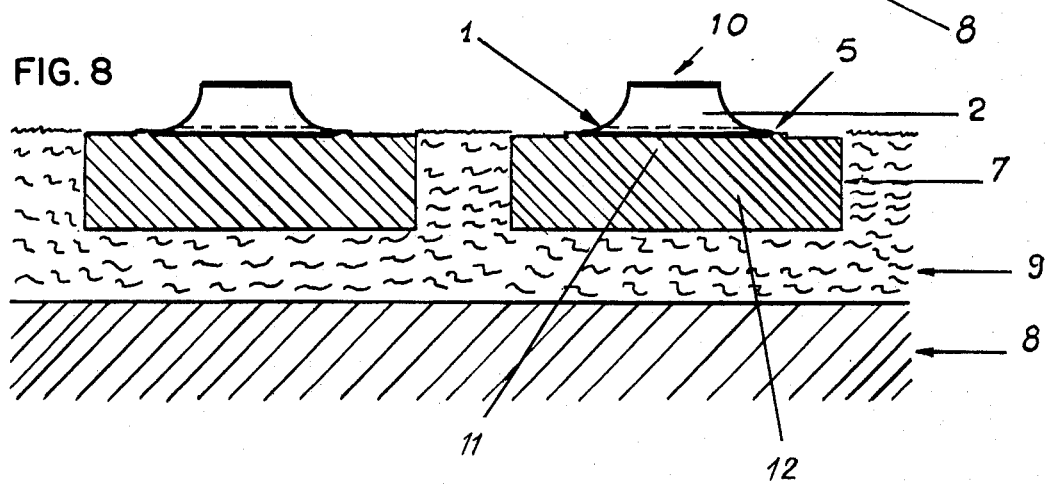

FIG. 8 finally shows as a section, two semiconductor portions or units with Mesa structure according to the invention.

Figure 1:
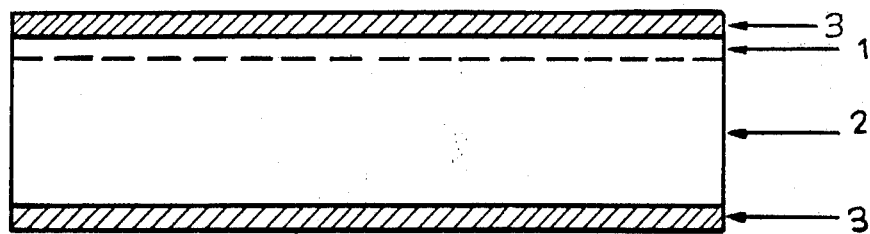
FIG. 1 shows a view, as a section, of a sheet or wafer of the semiconductor material which has junctions and is covered with oxide.
Figure 2:
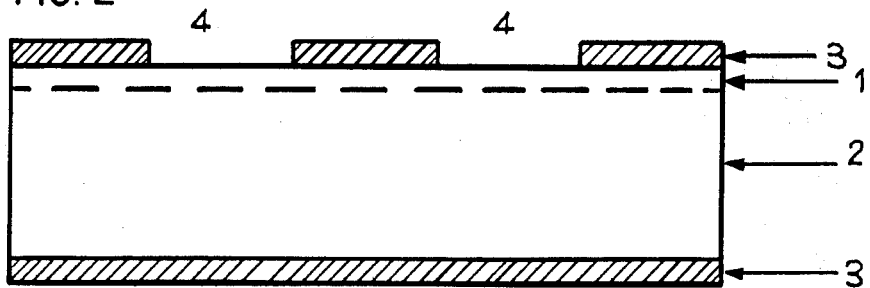
FIG. 2 is a view as a section of the sheet of FIG. 1 where the layer of oxide, which covers the junction, is partially cut away due to a photoengraving.
Figure 3:
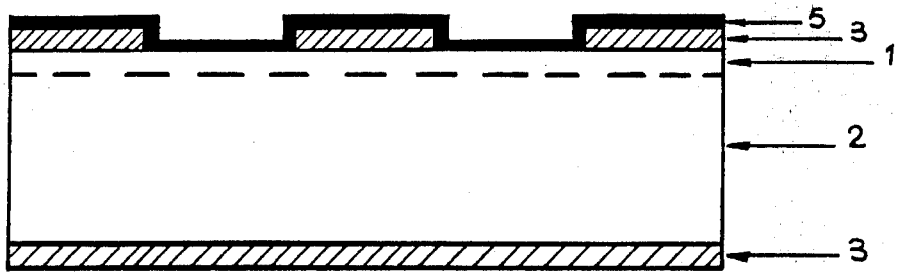
FIG. 3 is a view as a section of the sheet of FIG. 2 after the deposition of the flexible metal layer upon this layer or coating which covers the junction.
Figure 4:
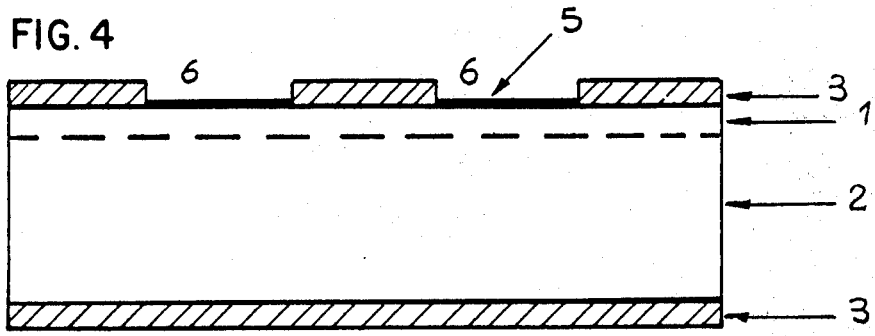
FIG. 4 is a view as a section of a sheet according to FIG. 3 where the metal layer has become subjected to a photoengraving.

Referring to FIG. 1, there is shown a sheet or wafer 2 of a semiconductor material provided with junction 1 and coated upon both of its surfaces with a layer 3 of oxide. The first step of the process of the present invention may be recognized from FIG. 2 where there are shown as 4, two zones in which the layer of oxide which covers the junction has become removed. In FIG. 3 is shown the deposition of a flexible metal layer 5 over all of the surface of the sheet which has undergone photoengraving. Thereafter, there occurs a removal of the flexible metal layer across the full surface of the sheet with the exception of those areas where the oxide had become removed, these areas remain coated with metal as indicated at 6 in FIG. 4.

Figure 5:
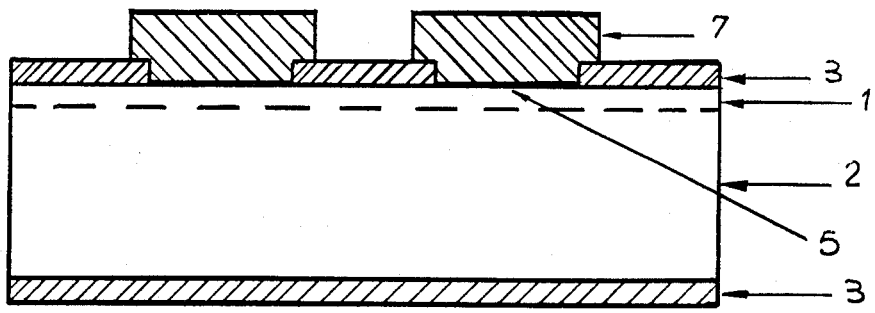
FIG. 5 is a view as a section of a sheet according to FIG. 4 in which the zones which become the supports of the sink have been caused to be built up on the base of an electrolytic deposition.
Figure 6:
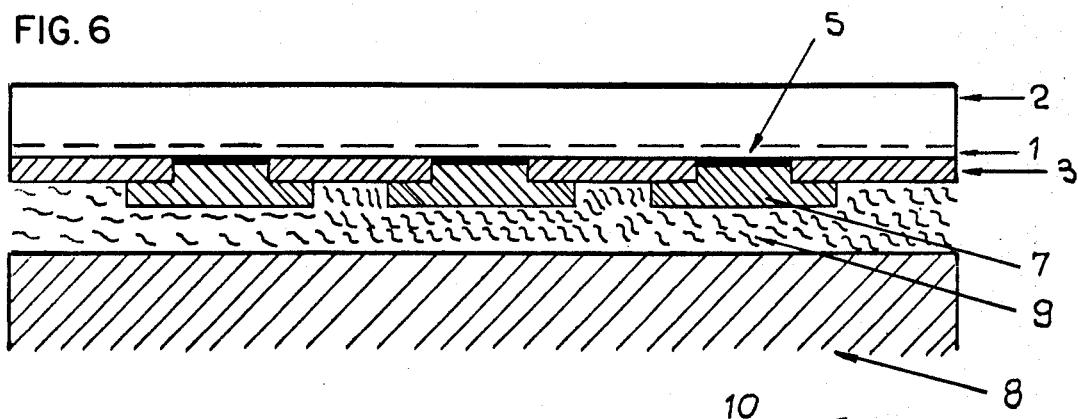
FIG. 6 is a view, as a section, of a sheet according to FIG. 5, adhered to a support and rendered thin (smoothed)
Figure 7:
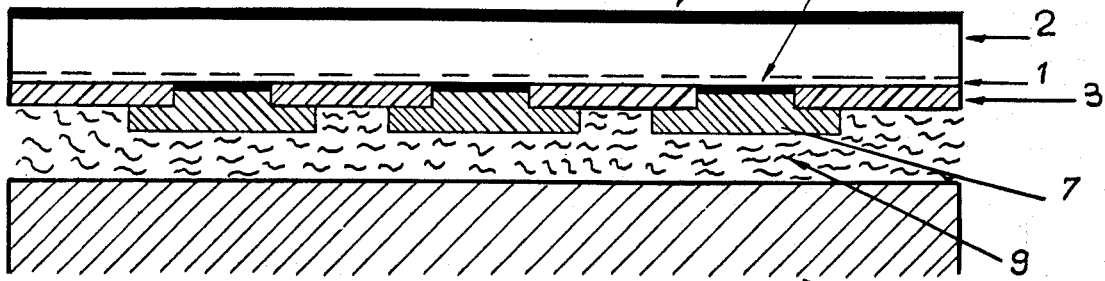
FIG. 7 is a view as a section of a sheet according to FIG. 6 where the free surface has become coated with a flexible metal layer.

In FIG. 5 there is shown the deposit 7 upon these areas 6. Thereafter, the sheet 2 becomes attached under use of the adhesive 9 upon a support 8. This is followed by a smoothing or deburring or thinning of the sheet, as is shown in FIG. 6. Next, as is shown in FIG. 7, a metal layer 10 is deposited upon all of the free surface of the sheet 2. The final step in the process of this invention is the creation of the Mesa structure, thereby the semiconductor units 11 become separated, they are equipped with integral thermal sinks 12, as one may recognize from FIG. 8.

The following is a description of one example of the manufacture of semiconductor units in accordance with the teaching of this invention.

The process described relates to creation of microwave diodes for operation in the IMPATT manner for the generation of and the amplification in the X-band. The process involves the following manufacturing steps:

a. Creation of the $P^+$ / N junction by thermal diffusion of boron, starting with a solid source of boron nitride in a two-phase process in which, first, a dope is deposited and, secondly, it is sunk or implanted into silicon. The correct time and temperature for the diffusion are selected so that a depth of the junction of about 2 microns is obtained.

b. Performing the sinking step, which occurs in an oxidizing atmosphere in a manner that a layer of silicon dioxide is formed upon the surface of the sheet or wafer.

c. Outlining by use of an ordinary photoetching process on the side of the $p^+$ layer, geometrically regular squares of 500 × 500 micron dimension. This removes the silicon dioxide by a chemical attack. The back of the sheet is protected by a photoresist when the oxide is being etched.

d. Deposition from the vapor phase in vacuo of a flexible chromium layer of 500 A and of a flexible gold layer of 3000 A.

e. Outlining by photoetching, using a screen which complements the one used under c), geometrically regular squares, whereafter is formed by a chemical attack upon the chromium and upon the gold, a number of ascending islands which thus are separated from each other by the thermal oxide.

f. Creation of an electrolytic deposit of gold which allows forming of sinks in a thickness between 100 and 150 microns; the electric connection of the individual sinks in the rising phase is obtained by making use of the high conductivity of the $P^+$ layer.

g. Bonding of the sheet with Sylgard 182 (a registered trade mark of Dow Corning Corporation, Midland, Mich., for silicone resin encapsulants) onto a support, which is followed by a deburring or grinding-down or a thinning, from the N- side, so as to obtain a thickness of the order of 25 to 50 microns. This thinning occurs by a chemical attack through use of hydroiodic, nitric and hydrofluoric acids.

h. Precipitating from the gas phase upon the surface of the N- type of a flexible layer of chromium of 500 A and of another layer of gold of 3000 A. By photoengraving or photoetching next become outlined geometrically circular regions of 150 microns diameter, whereby one uses devices which allow an electrolytic deposition of gold in the thickness of 2 to 3 microns, and a subsequent chemical attack upon the gold and upon the chromium. These circular regions are made to occur so that they will correspond to the center of the sinks which become deposited upon the opposite surface, whereby one obtains an orientation if one refers to the lines which occur at the edge of the sheet.

i. A chemical attack is next under use of hydrofluoric and nitric acids, to simultaneously bring about the formation of the Mesa structure upon the sinks, and their automatic separation. Typical dimensions are: Upper diameter 130 microns, lower diameter 160 microns, height 25 microns, and such Mesas are located upon a sink of 600 microns × 600 microns which is 100 microns thick.

The invention has been described as its preferred embodiment. It may be modified and variants may be applied by parties versed in the art, and all such changes still will fall within the purview of the appended claims.

What is claimed is:

1. A process for the production of a semiconductor device with an integral heatsink, starting with a sheet of semiconductor material having a P / N junction, comprising the steps of uniformly coating both surfaces of the sheet of semiconductor material with a layer of dielectric, removing by photoetching from a finite number of zones the layer of dielectric from one surface of said sheet to form a finite number of locations for the sinks, coating the finite number of zones with a first flexible metal layer, depositing a metal layer over said first flexible metal layer at the approximate areas of said zones to establish the sink formation, bonding the said one surface of said sheet and its associated coatings with an adhesive to a support, thinning down the other surface of said sheet of semiconductor material, depositing a second flexible metal layer over said other surface of said sheet, and removing semiconductor material from the body of said sheet in the intersticial spaces between and among the said zones to produce the separation of the semiconductor units with Mesa profiles which are equipped with sinks.

2. A process for the production of a semiconductor device as claimed in claim 1, wherein the step of coating the sheet with a layer of dielectric consists of covering said sheet of semiconductor material uniformly with a flexible layer of oxide by heating in an oxidizing atmosphere.

3. A process for the production of a semiconductor device as claimed in claim 1, wherein the step of coating the sheet with a layer of dielectric consists of covering said sheet of semiconductor material uniformly with a flexible layer of dielectric through use of a cathodic deposition with radio frequency.

4. A process for the production of a semiconductor device as claimed in claim 1, wherein the step of coating the sheet with dielectric consists of coating said sheet of semiconductor material uniformly with a flexible layer of dielectric using a precipitation in vacuum.

5. A process for the production of a semiconductor device as claimed in claim 1, wherein the step of coating the sheet with dielectric consists of covering said sheet of semiconductor material with a flexible coating of dielectric by a reactive deposition of silicon dioxide at a low temperature.

6. A process for the production of a semiconductor device as claimed in claim 1, wherein the step of coating the sheet with dielectric consists of coating said sheet of semiconductor material with a flexible layer of dielectric with an anodic oxidation base.

7. A process for the production of a semiconductor device as claimed in claim 1, wherein the step of coating the sheet with dielectric consists of coating said sheet of semiconductor material with a flexible layer of dielectric on the base of a deposition of oxides in the form of an emulsion.

8. A process for the production of a semiconductor device as claimed in claim 1, wherein said coating with the first flexible metal layer comprises the operations of depositing upon one surface of the sheet, a flexible metal layer, and of removing by photoetching the metal material from said layer restrictively at the external areas of the surface of said zones.

9. A process for the production of a semiconductor device as claimed in claim 1, wherein said coating with the first flexible metal layer comprises the operations of placing a metal screen upon the one surface of the sheet, and of depositing a flexible metal layer through the openings in said screen.

10. A process for the production of a semiconductor device as claimed in claim 8, wherein said flexible metal layer is deposited by a vapor-phase precipitation in vacuum.

11. A process for the production of a semiconductor device as claimed in claim 8, wherein said flexible metal layer is deposited by a cathodic deposition at low pressure.

12. A process for the production of a semiconductor device as claimed in claim 8, wherein said flexible metal layer is deposited by an electrolytic procedure.

13. A process for the production of a semiconductor device as claimed in claim 8, wherein said flexible metal layer is deposited by means of a chemical process, without the passage of any current.

14. A process for the production of a semiconductor device as claimed in claim 1, wherein said thinning operation on the surface of the sheet of the semiconductor material is done by a mechanical process.

15. A process for the production of a semiconductor device as claimed in claim 1, wherein said thinning operation on the surface of the sheet of the semiconductor material is done by an electrochemical process.

* * * * *